(12) United States Patent
Leobandung et al.

(10) Patent No.: US 8,637,381 B2
(45) Date of Patent: Jan. 28, 2014

(54) HIGH-K DIELECTRIC AND SILICON NITRIDE BOX REGION

(75) Inventors: Effendi Leobandung, Wappinger Falls, NY (US); Dae-Gyu Park, Poughquag, NY (US); Shom S. Ponoth, Clifton Park, NY (US); Zhibin Ren, Hopewell Junction, NY (US); Ghavam G. Shahidi, Pound Ridge, NY (US); Leathen Shi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 13/274,381

(22) Filed: Oct. 17, 2011

(65) Prior Publication Data
US 2013/0093039 A1    Apr. 18, 2013

(51) Int. Cl.
*H01L 27/092* (2006.01)
*H01L 21/336* (2006.01)
*H01L 27/12* (2006.01)
*H01L 21/762* (2006.01)
*H01L 29/786* (2006.01)

(52) U.S. Cl.
CPC ....... *H01L 27/1203* (2013.01); *H01L 21/76251* (2013.01); *H01L 29/78603* (2013.01)
USPC .......... 438/459; 257/E21.567; 257/353; 257/347; 438/455; 438/458; 438/164

(58) Field of Classification Search
CPC ............... H01L 21/76251; H01L 21/7624; H01L 21/76297; H01L 21/76275
USPC ................. 438/412, 455, 458, 459
See application file for complete search history.

(56) References Cited

U.S. PATENT DOCUMENTS

| | | | | |
|---|---|---|---|---|
| 3,997,381 A | * | 12/1976 | Wanlass | 438/10 |
| 5,567,966 A | * | 10/1996 | Hwang | 257/347 |
| 5,659,192 A | * | 8/1997 | Sarma et al. | 257/347 |
| 6,071,822 A | * | 6/2000 | Donohue et al. | 438/712 |
| 6,682,973 B1 | | 1/2004 | Paton et al. | |
| 7,776,716 B2 | * | 8/2010 | Deguet et al. | 438/455 |
| 7,785,706 B2 | | 8/2010 | Schroeder et al. | |
| 2003/0207545 A1 | * | 11/2003 | Yasukawa | 438/459 |

(Continued)

FOREIGN PATENT DOCUMENTS

EP     1124262 B1    4/2006

OTHER PUBLICATIONS

Wolf, Silicon Processing for the VLSI Era, 2000, 2nd ed. vol. 1, pp. 202-203.*
Wolf, Silicon Processing for the VLSI Era, 2002, vol. 4, p. 145.*

*Primary Examiner* — Tom Thomas
*Assistant Examiner* — John Bodnar
(74) *Attorney, Agent, or Firm* — Joseph J. Petrokaitis; Hoffman Warnick LLC

(57) ABSTRACT

Aspects of the invention provide for preventing undercuts during wafer etch processing and enhancing back-gate to channel electrical coupling. In one embodiment, aspects of the invention include a semiconductor structure, including: a high-k buried oxide (BOX) layer atop a bulk silicon wafer, the high-k BOX layer including: at least one silicon nitride layer; and a high-k dielectric layer; and a silicon-on-insulator (SOI) layer positioned atop the high-k BOX layer.

12 Claims, 11 Drawing Sheets

(56) References Cited

U.S. PATENT DOCUMENTS

| | | |
|---|---|---|
| 2004/0002197 A1 | 1/2004 | Fathimulla et al. |
| 2004/0038488 A1* | 2/2004 | Mouli .................. 438/292 |
| 2004/0159908 A1 | 8/2004 | Fathimulla et al. |
| 2006/0012004 A1* | 1/2006 | Chen et al. .................. 257/507 |
| 2007/0049043 A1 | 3/2007 | Muthukrishnan et al. |
| 2009/0102026 A1* | 4/2009 | Lee et al. .................. 257/635 |
| 2009/0236595 A1 | 9/2009 | Atanackovic |
| 2010/0173473 A1* | 7/2010 | Jinbo et al. .................. 438/458 |
| 2010/0181596 A1 | 7/2010 | Suzuki et al. |
| 2010/0221869 A1 | 9/2010 | Schroeder et al. |
| 2010/0258882 A1 | 10/2010 | Magnee et al. |
| 2011/0001184 A1 | 1/2011 | Andrieu et al. |
| 2011/0207246 A1* | 8/2011 | Pitney et al. .................. 438/14 |
| 2011/0207295 A1* | 8/2011 | Landru et al. .................. 438/459 |
| 2013/0012024 A1* | 1/2013 | Aspar .................. 438/689 |

\* cited by examiner

HIGH-K DIELECTRIC AND SILICON NITRIDE BOX REGION

BACKGROUND OF THE INVENTION

The subject matter disclosed herein relates generally to integrated circuits. More specifically, the disclosure provided herein relates to a semiconductor structure including a high-k buried oxide (BOX) layer.

In conventional silicon-on-insulator (SOI) wafer processing, the buried-oxide (BOX) layer normally includes silicon dioxide. However, during reactive ion etching, severe silicon dioxide BOX loss and undercut is observed. This can lead to device shorts, patterning difficulty due to the degraded topography, and yield degradation. There are also problems with the back-gate to channel electrical coupling.

BRIEF DESCRIPTION OF THE INVENTION

Aspects of the invention provide for preventing undercuts during wafer etch processing and enhancing back-gate to channel electrical coupling. In one embodiment, aspects of the invention include a semiconductor structure, including: a high-k buried oxide (BOX) layer atop a bulk silicon wafer, the high-k BOX layer including: at least one silicon nitride layer; and a high-k dielectric layer; and a silicon-on-insulator (SOI) layer positioned atop the high-k BOX layer.

A first aspect of the invention provides a semiconductor structure, comprising: a high-k buried oxide (BOX) layer atop a bulk silicon wafer, the high-k BOX layer including: at least one silicon nitride layer; and a high-k dielectric layer; and a silicon-on-insulator (SOI) layer positioned atop the high-k BOX layer.

A second aspect of the invention provides a method of forming a semiconductor structure, the method comprising: providing a donor wafer including a silicon-on-insulator (SOI) layer and a buried oxide (BOX) layer; depositing a silicon nitride layer atop the SOI layer; depositing a high-k dielectric layer atop the silicon nitride layer; sealing the high-k dielectric layer; and bonding a bulk silicon wafer to the high-k dielectric layer.

A third aspect of the invention provides a semiconductor structure, comprising: a high-k buried oxide (BOX) layer atop a bulk silicon wafer, the high-k BOX layer including; a first silicon nitride layer and a second silicon nitride layer; and a high-k dielectric layer therebetween; and a silicon-on-insulator (SOI) layer positioned atop the high-k BOX layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

The subject matter disclosed herein relates generally to integrated circuits. More specifically, the disclosure provided herein relates to a semiconductor structure including a high-k buried oxide (BOX) layer.

In conventional silicon-on-insulator (SOI) wafer processing, the buried-oxide (BOX) layer normally includes silicon dioxide. However, during reactive ion etching, severe silicon dioxide BOX loss and undercut is observed. This can lead to device shorts, patterning difficulty due to the degraded topography, and yield degradation. There are also problems with the back-gate to channel electrical coupling.

Aspects of the invention provide for preventing undercuts during wafer etch processing and enhancing back-gate to channel electrical coupling. In one embodiment, aspects of the invention include a semiconductor structure, including: a high-k buried oxide (BOX) layer atop a bulk silicon wafer, the high-k BOX layer including; at least one silicon nitride layer; and a high-k dielectric layer; and a silicon-on-insulator (SOI) layer positioned atop the high-k BOX layer. The silicon nitride layer serves to stop the active region reactive ion etching during the SOI layer patterning process, to prevent undercuts. Further, the high-k dielectric layer serves to stop the spacer reactive ion etching to prevent undercuts. The high-k dielectric layer also prevents undercuts during any subsequent silicide clean or epitaxial growth. Additionally, the higher dielectric constants of the high-k BOX layer (i.e., the high-k dielectric layer and the silicon nitride layer) enhance the back-gate to channel electrical coupling.

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Figure 1:
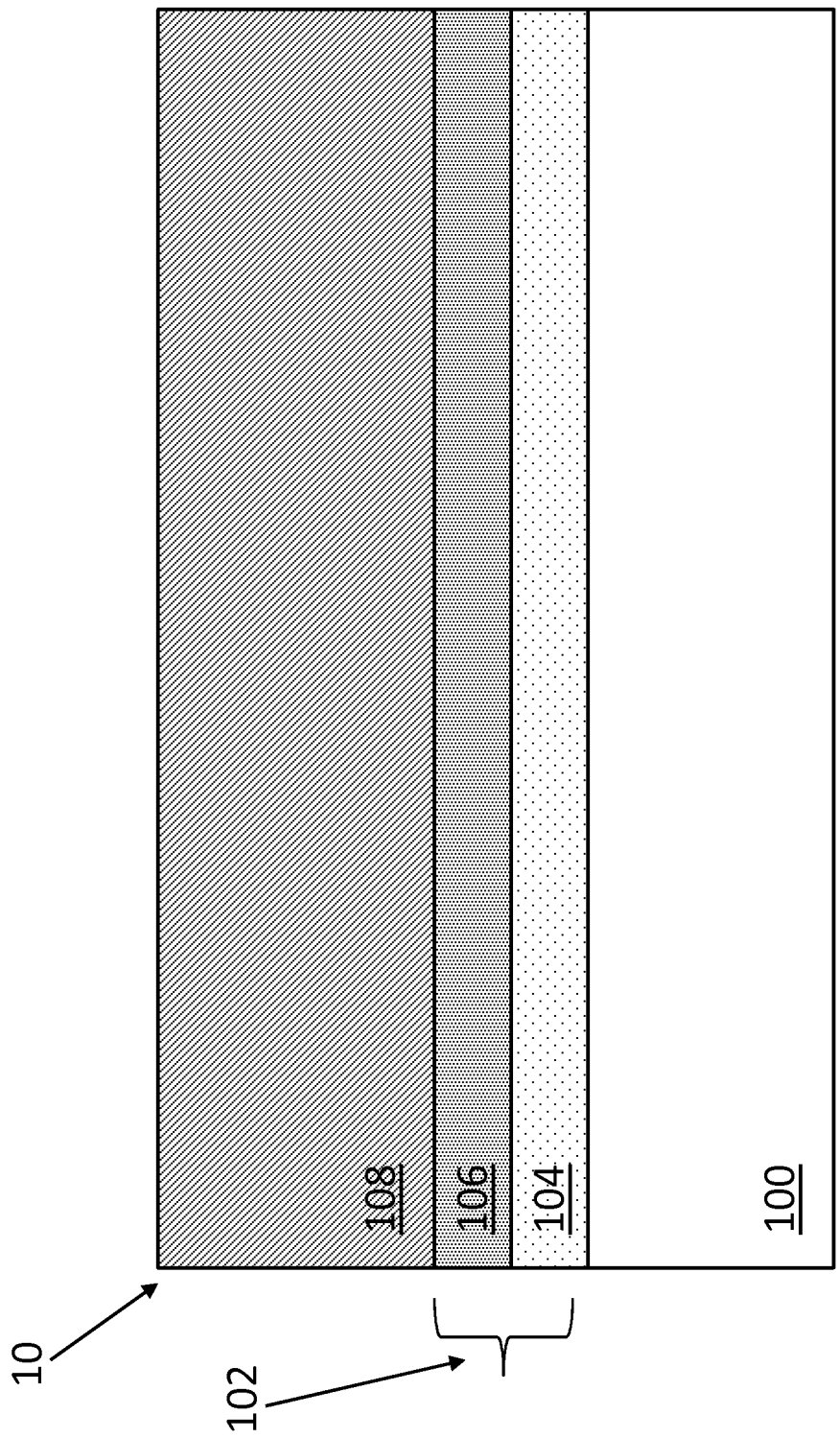
FIG. 1 shows a cross-sectional view of a semiconductor structure according to embodiments of the invention.

Turning now to FIG. 1, a cross-sectional view of a semiconductor structure 10 according to embodiments of the invention is shown. Semiconductor structure 10 may include a conventional bulk silicon wafer 100 and a silicon-on-insulator (SOI) layer 108. Although the wafer 100 is shown as a bulk silicon wafer, it is understood that the semiconductor structure 10 may include any now known or later developed semiconductor wafer, such as, but not limited to, Ge or III-V semiconductor wafers. The SOI layer 108 may have a thickness of approximately 5 to 50 nanometers.

As shown in FIG. 1, between the bulk silicon wafer 100 and the SOI layer 108, the semiconductor structure 10 includes a high-k buried oxide (BOX) layer 102. That is, the high-k BOX layer 102 is positioned atop the bulk silicon wafer 100. In the embodiment shown in FIG. 1, the high-k BOX layer 102 includes a high-k dielectric layer 104 and a silicon nitride layer 106 located atop the high-k dielectric layer 104.

The silicon nitride layer 106 may include one of SiN and $Si_3N_4$. The silicon nitride layer 106 may have a thickness of approximately 5 nanometers. The high-k dielectric layer 104 may include any now known or later developed high-k dielectric material, such as, but not limited to, hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), and erbium oxide ($ErO_x$). The high-k dielectric layer 104 may have a thickness of approximately 2 to 5 nanometers.

Figure 2:
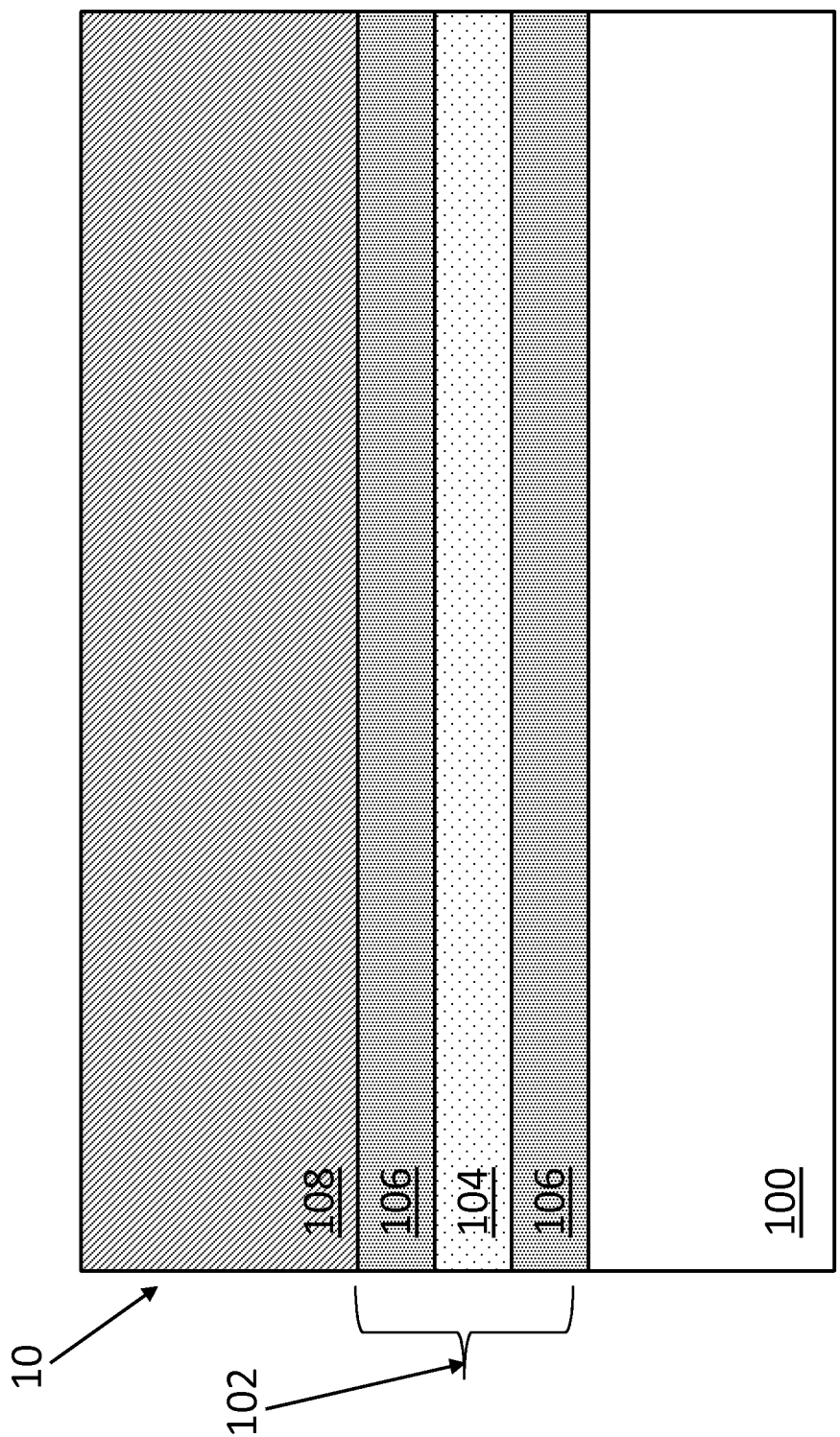
FIG. 2 shows a cross-sectional view of a semiconductor structure according to embodiments of the invention.

Turning now to FIG. 2, a cross-sectional view of semiconductor structure 10 according to embodiments of the invention is shown. In this embodiment, the semiconductor structure 10 includes the bulk silicon wafer 100 and the SOI layer 108. However, the high-k BOX layer 102 includes two silicon nitride layers 106. That is, the high-k dielectric layer 104 is between each of the silicon nitride layers 106.

FIGS. 3-11 show a method of forming semiconductor structure 10 according to an embodiment of the invention. Although FIGS. 3-11 only show the method of forming semiconductor structure 10 in FIG. 1, it is understood that a similar method may be employed to form semiconductor structure 10 in FIG. 2.

Figure 3:
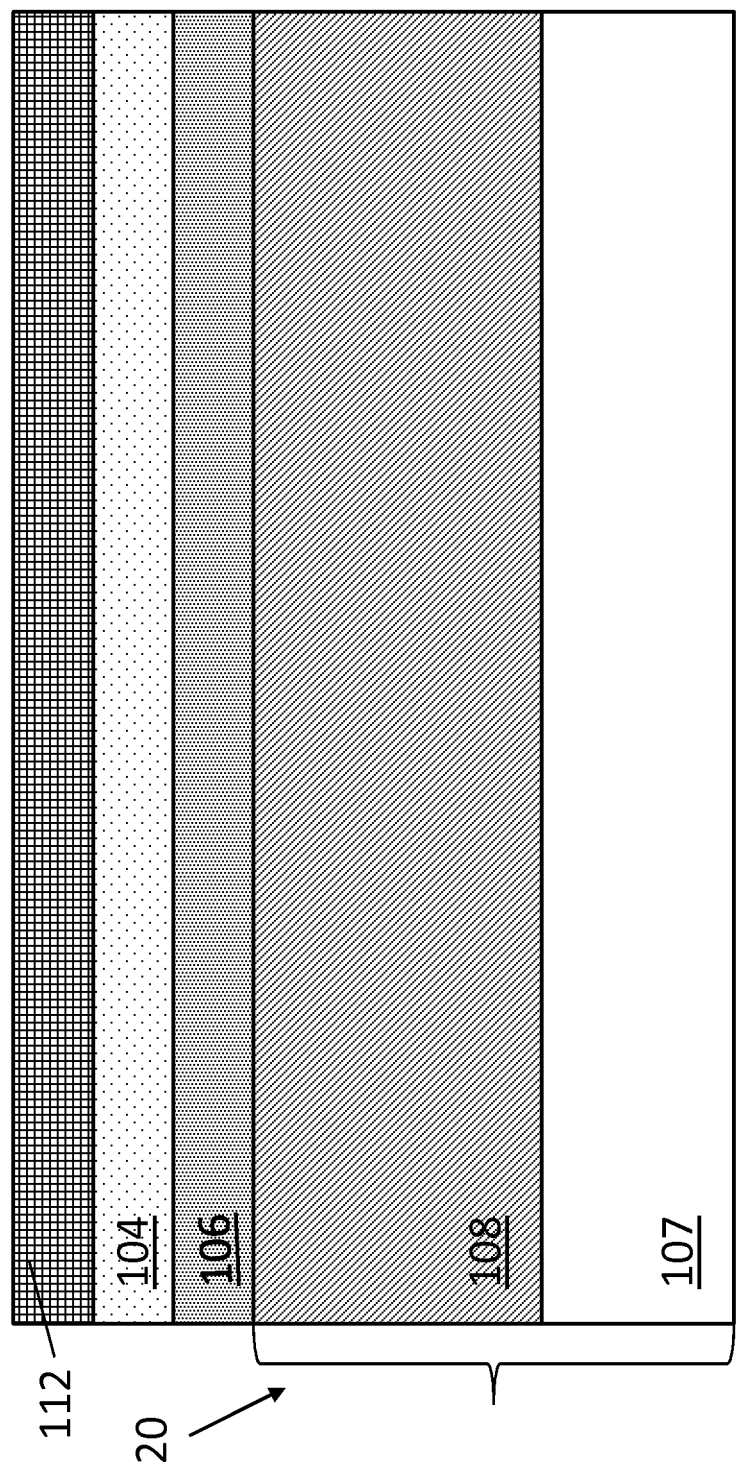
FIGS. 3-11 show a method of forming a semiconductor structure according to embodiments of the invention.

Turning to FIG. 3, a donor wafer 20 is provided. The donor wafer 20 includes the SOI layer 108 positioned atop a BOX layer 107. A silicon nitride layer 106 is deposited atop the SOI layer 108. When initially deposited, the SOI layer 108 may have a thickness of approximately 500 nanometers. As will be described later, the SOI layer 108 may be thinned to a thickness of approximately 5 to 50 nanometers.

As mentioned above, the silicon nitride layer 106 includes one of SiN and $Si_3N_4$. The silicon nitride layer 106 may have a thickness of approximately 5 nanometers. The high-k dielectric layer 104 is deposited atop the silicon nitride layer 106. As mentioned above, the high-k dielectric layer 104 may include any now known or later developed high-k dielectric material, such as, but not limited to, hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), and erbium oxide ($ErO_x$). The high-k dielectric layer 104 may have a thickness of approximately 2 to 5 nanometers. An optional oxide layer 112 may also be deposited atop the high-k dielectric layer 104.

Figure 4:
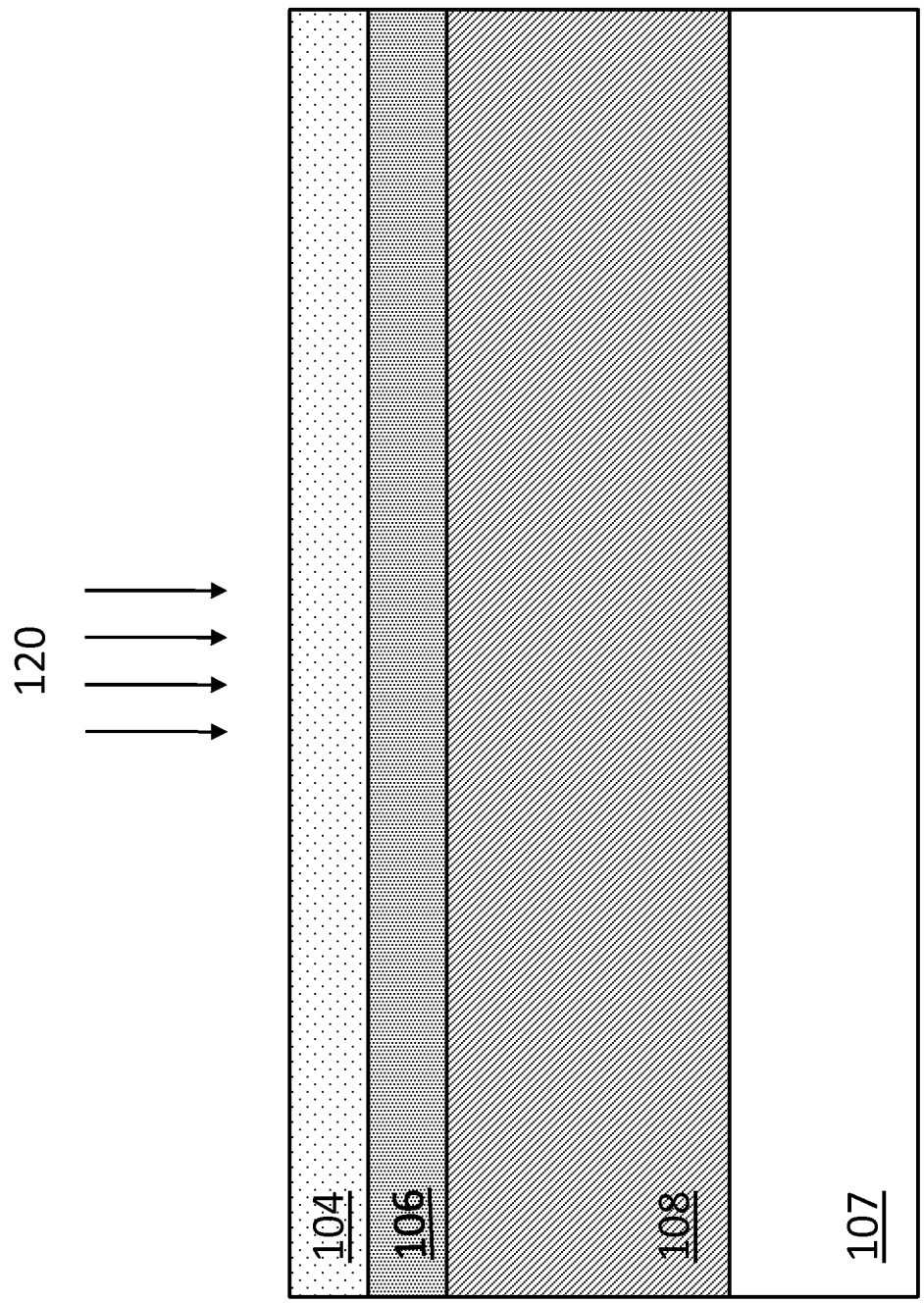

Turning now to FIG. 4, the high-k dielectric layer 104 is sealed by performing a silicon dioxide chemical mechanical polish (CMP) 120 in order to seal a plurality of pinholes (not shown) within the high-k dielectric layer 104. Without this silicon dioxide CMP sealing, bubbles could form during the wafer bonding process (FIG. 5).

Figure 5:
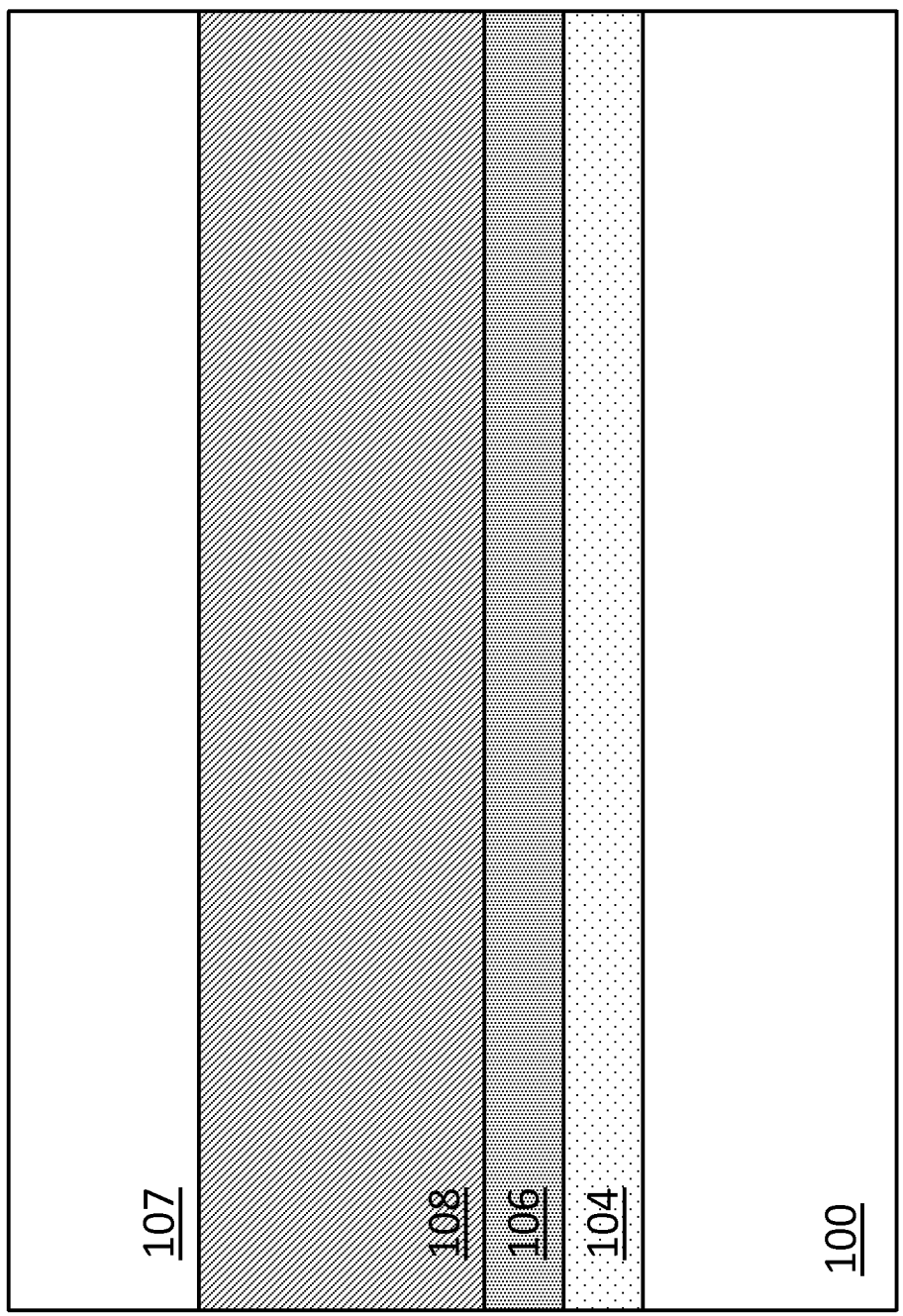

Turning now to FIG. 5, a bulk silicon wafer 100 is bonded to the high-k dielectric layer 104. It is noted that the orientation of the semiconductor structure 10 is flipped, such that the bulk silicon wafer 100 is at the bottom of FIG. 5.

Figure 6:
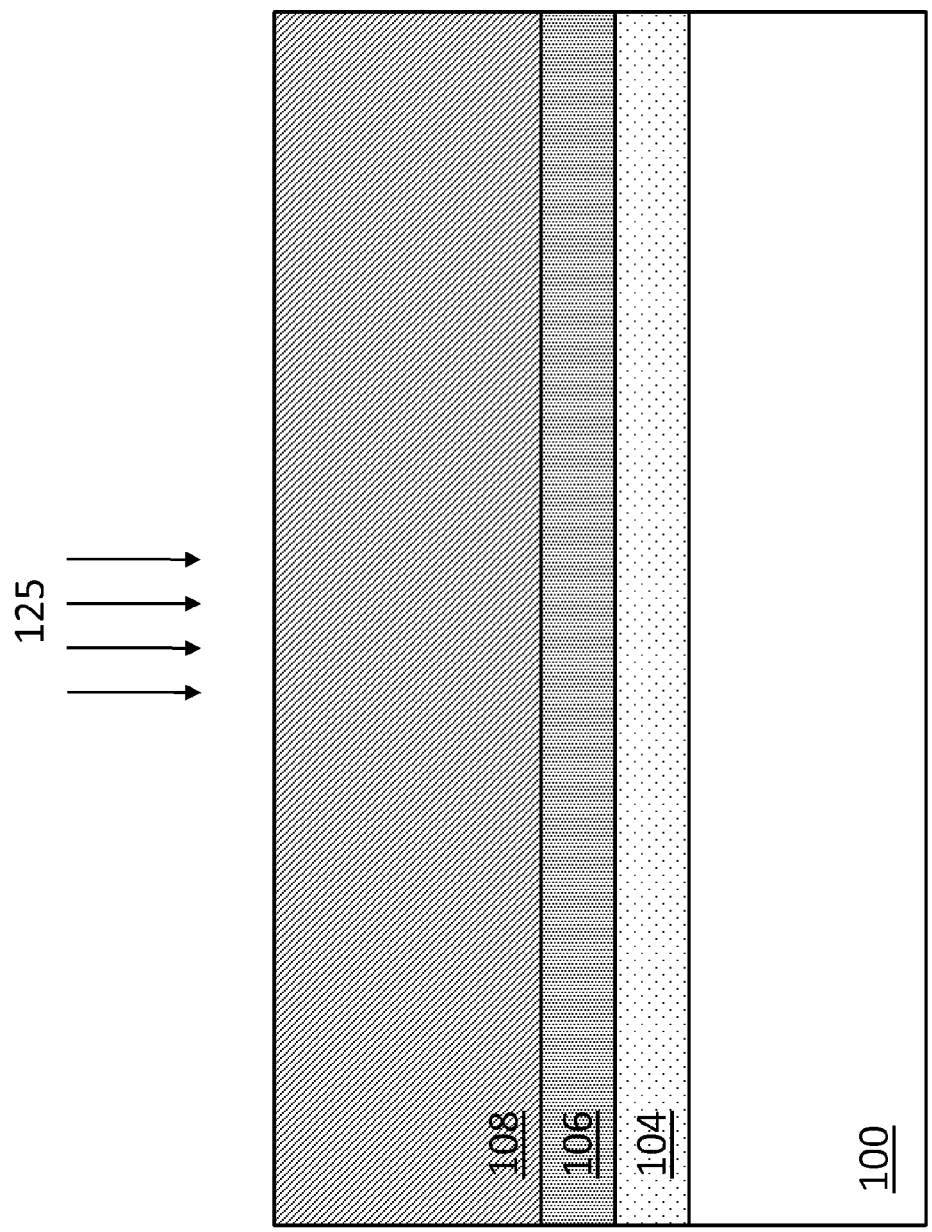

After bonding the bulk silicon wafer 100, the BOX layer 107 is removed using by reactive ion etching (RIE) 125 (FIG. 6). For example, the BOX layer 107 may be removed with a hydrofluoride based wet etching, such as a hydrofluoride RIE 125. Since the silicon nitride layer 106 is not the conventional silicon dioxide, there is no hydrofluoride RIE-related box recess and undercut, as there would be with the conventional silicon dioxide.

Figure 7:
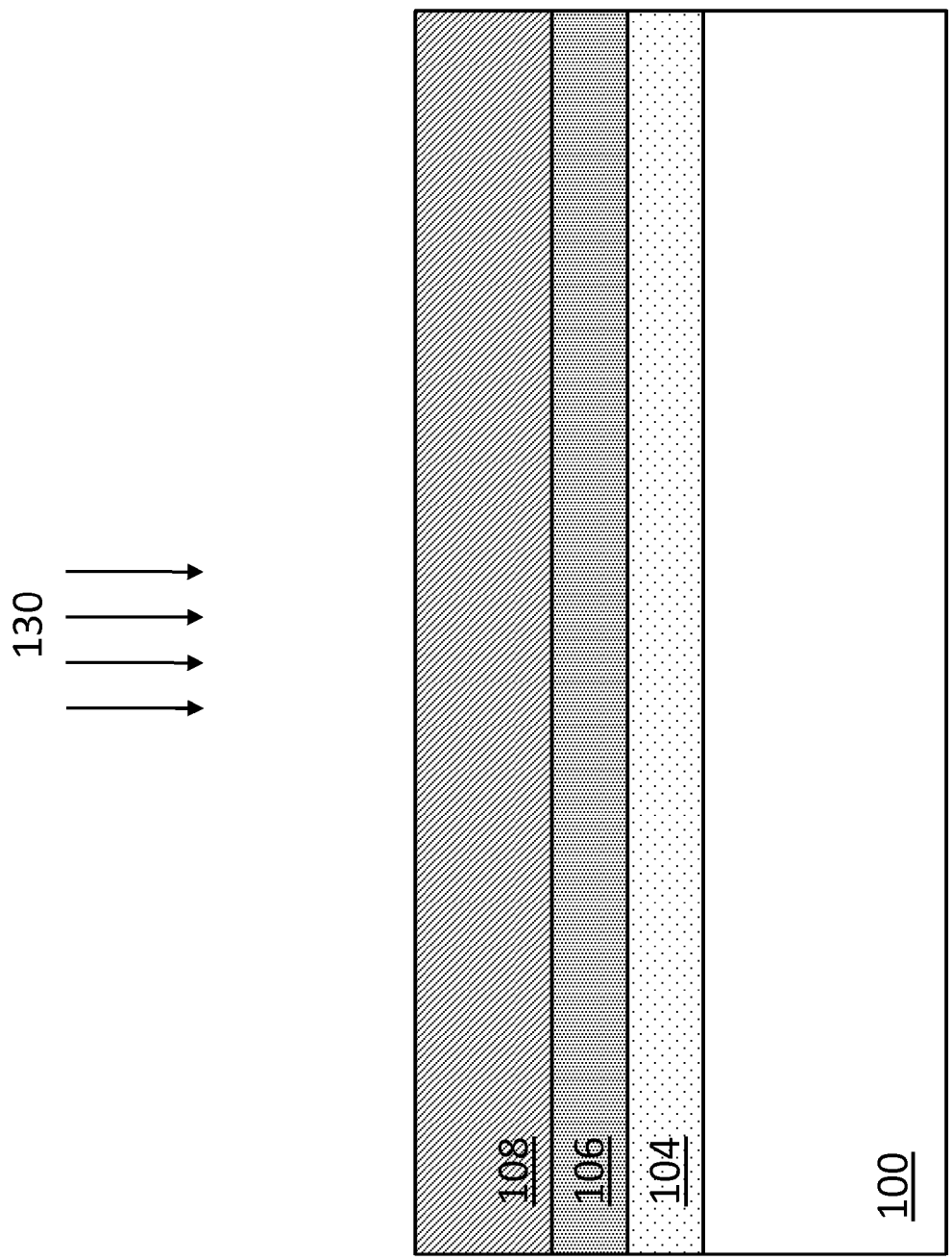

Once the BOX layer 107 is removed, a thickness of the SOI layer 108 is thinned from approximately 500 nanometers to approximately 5 to 50 nanometers. As seen in FIG. 7, the SOI layer 108 may be thinned by combination of thermal oxidation 130 and by RIE cycles. The RIE may be, for example, a hydrofluoride based wet etching.

Figure 8:
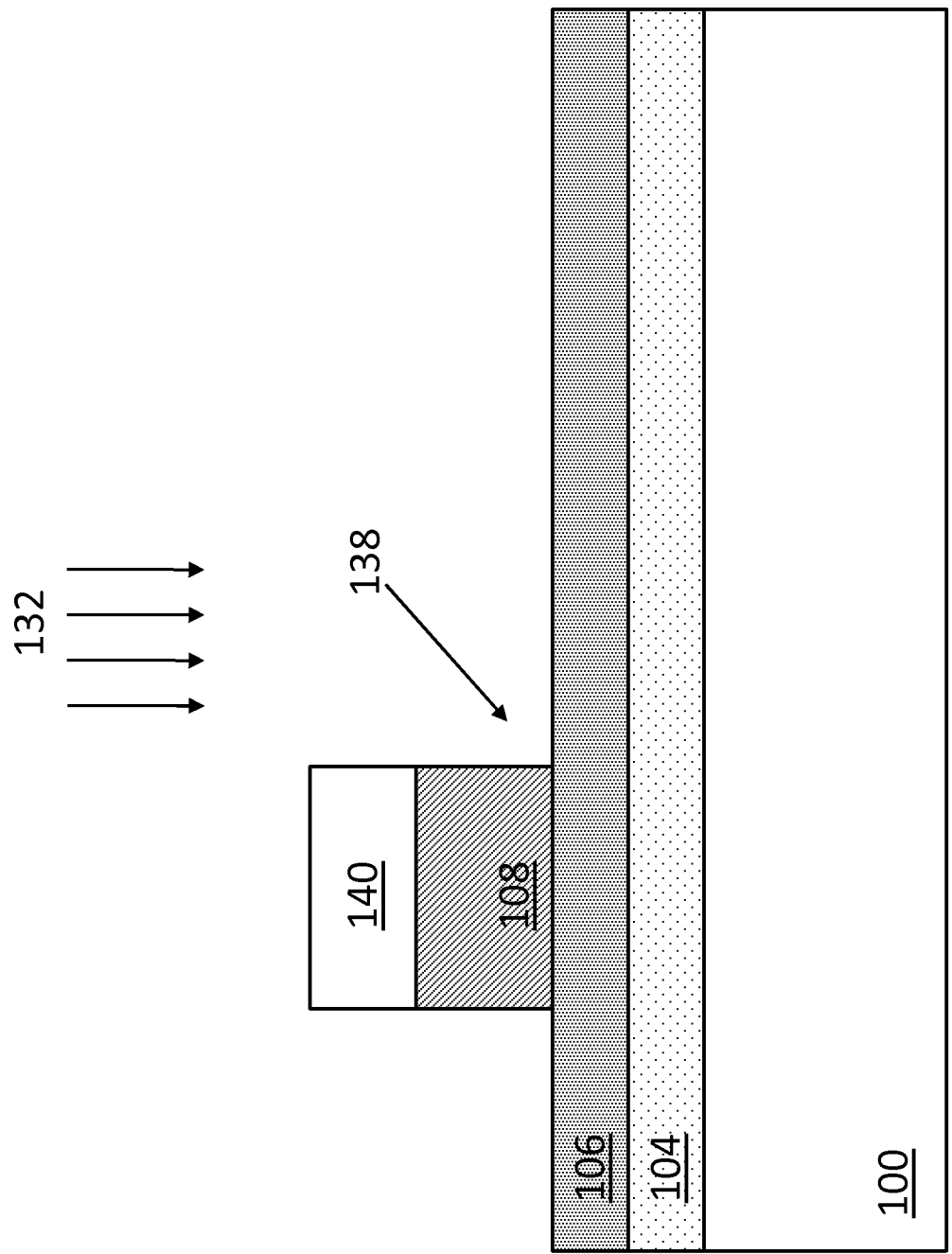

Turning now to FIG. 8, an active region 138 of the SOI layer 108 is patterned by a resist 1140. The active region 138 of the SOI layer 108 is patterned by an RTE 132 of the SOI that stops at the silicon nitride layer 106. The RTE 132 may be, for example, a dry based anisotropic RIE 132, such as a directional ion beam etching. Although not shown, RIE 132 is followed by a hydrofluoride clean solution. Since the silicon nitride layer 106 is not the conventional silicon dioxide, there is no hydrofluoride-related recess and undercut, as there would be with the conventional silicon dioxide.

Figure 9:
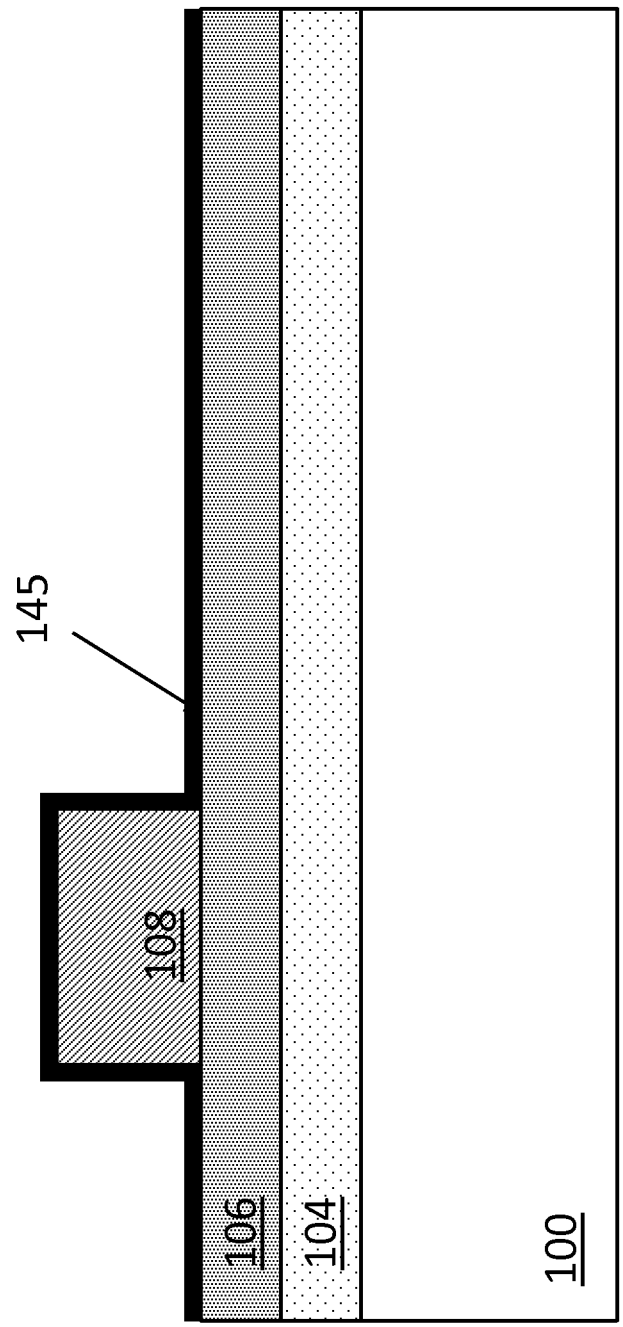
Figure 10:
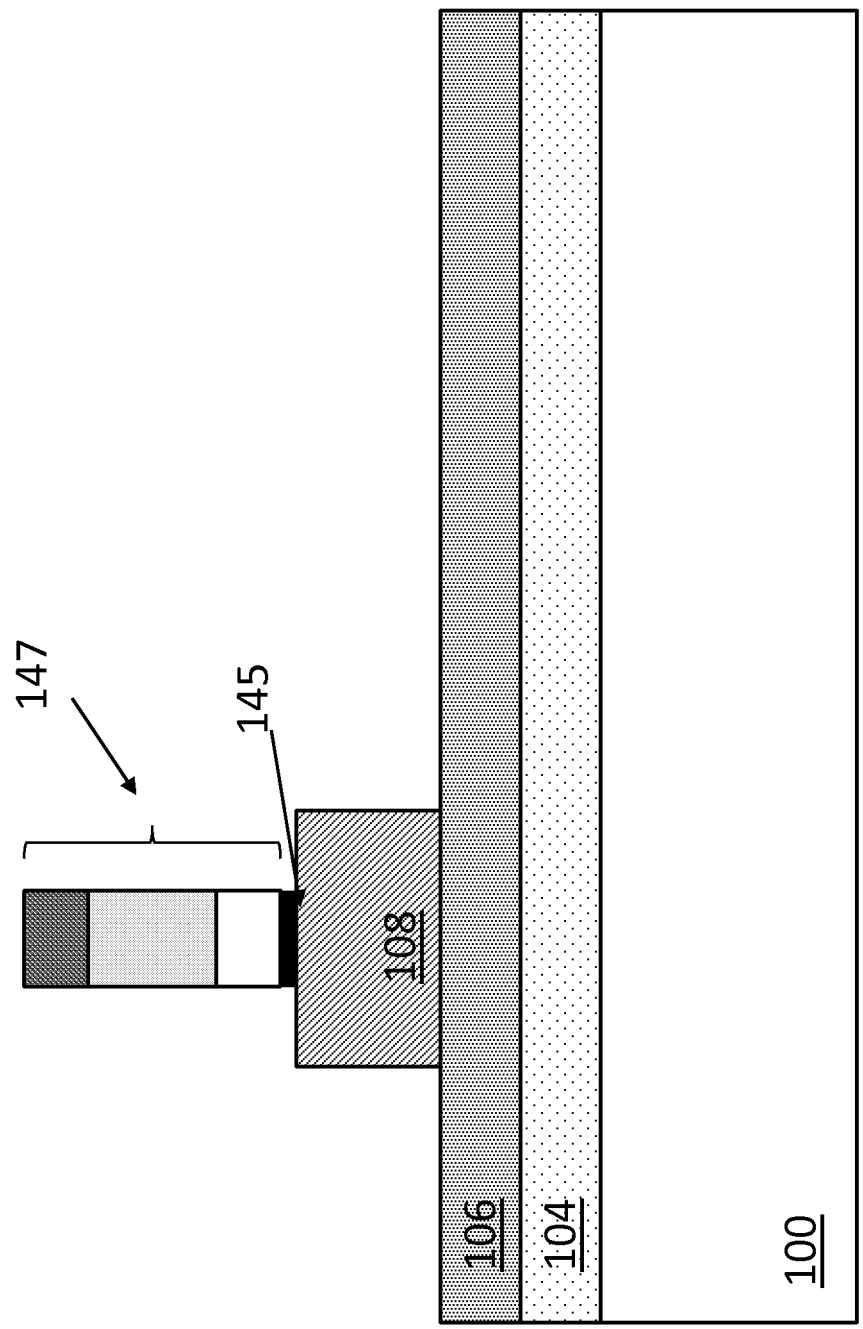

Turning now to FIG. 9, a high-k metal gate 145 is deposited over the active region 138 of the SOI layer 108. The coverage of the high-k metal gate 145 is improved over the conventional wafer processing, since there is no recess and undercuts in the SOI layer 108. Therefore, the high-k metal gate 145 will not be trapped under the edges of the active region 138 of the SOI layer 108. Turning now to FIG. 10, a conventional mal gate stack process is performed to form gate stack 147. There is improved patterning of the gate stack 147 because of the improved surface topography of the semiconductor structure 10.

Figure 11:
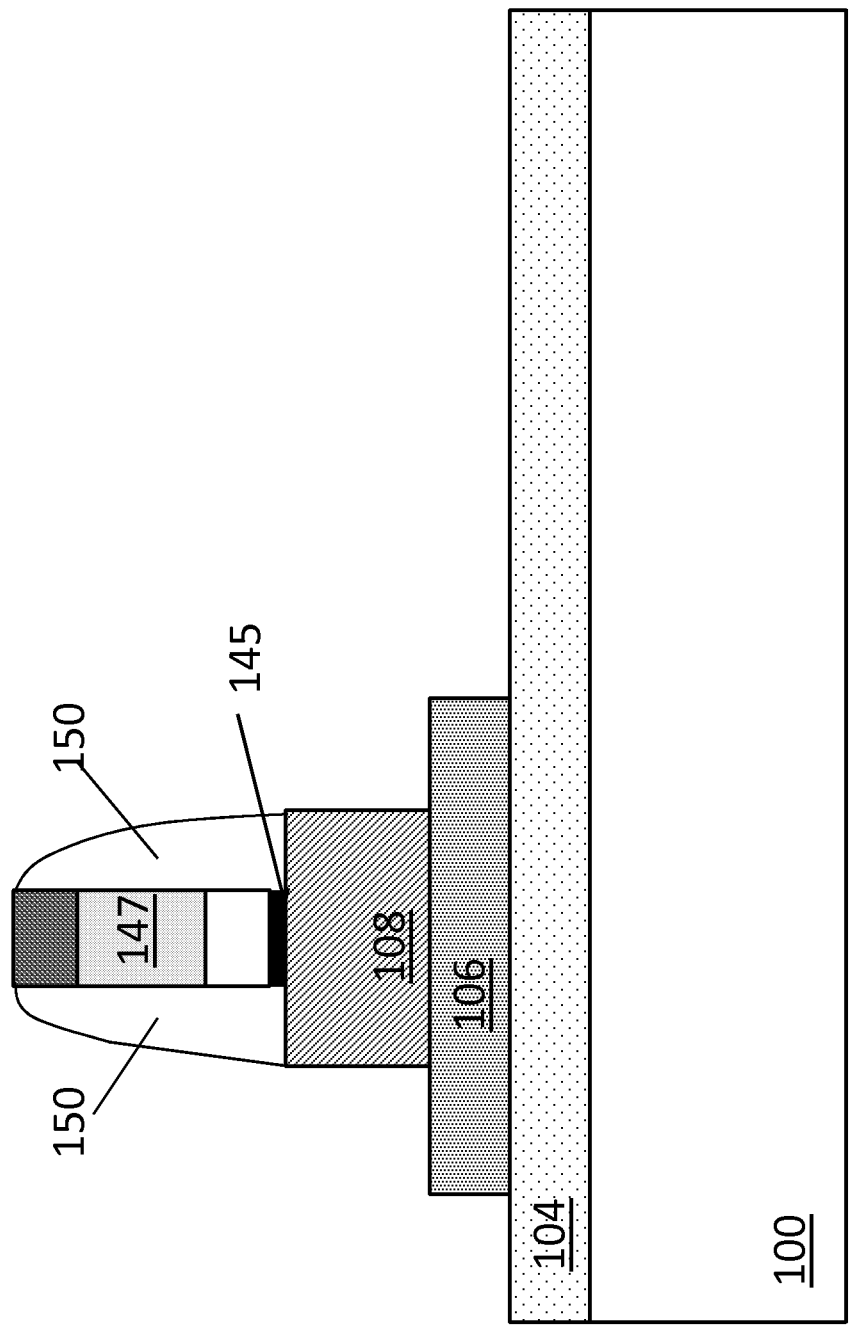

Turning now to FIG. 11, spacers 150 are formed around the gate stack 147. Spacers 150 may include silicon nitride, as known in the art. The RIE (not shown) to form spacers 150 stops at the SOI layer 108 and high-k dielectric layer 104, and the silicon nitride layer 106/high-k dielectric layer 104 substrate minimizes the RIE related undercuts.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a semiconductor structure, the method comprising:
   providing a donor wafer, the donor wafer including a silicon-on-insulator (SOI) layer being positioned above a separate buried oxide (BOX) layer;
   depositing a silicon nitride layer above the SOI layer and the buried oxide layer;
   depositing a high-k dielectric layer above the silicon nitride layer and the buried oxide layer;
   sealing the high-k dielectric layer; and
   bonding a bulk silicon wafer to the high-k dielectric layer.

2. The method of claim 1, wherein sealing the high-k dielectric layer further comprises performing a silicon dioxide chemical mechanical polish, such that a plurality of pinholes in the high-k dielectric layer are sealed.

3. The method of claim 1, wherein the silicon nitride layer includes one of: SiN and $Si_3N_4$.

4. The method of claim 1, wherein the high-k dielectric layer comprises one of:
   hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), and erbium oxide ($ErO_x$).

5. The method of claim 1, further comprising removing the BOX layer using a hydrofluoride based wet etching.

6. The method of claim 5, further comprising thinning the SOI layer by performing thermal oxidation and a hydrofluoride based wet etching.

7. The method of claim 6, further comprising patterning an active region of the SOI layer.

8. The method of claim 7, wherein patterning the active region of the SOI layer includes performing a reactive ion etch to stop at the silicon nitride layer.

9. The method of claim 8, further comprising depositing a high-k metal gate over the active region of the SOI layer.

10. The method of claim 9, further comprising:
performing a gate stack process to the SOI layer to form a gate stack; and,
forming spacers around the gate stack by a reactive ion etch, wherein the reactive ion etch stops at the SOI layer and high-k dielectric layer.

11. A method of forming a semiconductor structure, the method comprising:
providing a donor wafer, the donor wafer including a silicon-on-insulator (SOI) layer being positioned above a buried oxide (BOX) layer;
depositing a first silicon nitride layer above the SOI layer;
depositing a high-k dielectric layer above the silicon nitride layer;
sealing the high-k dielectric layer;
depositing a second silicon nitride layer above the high-k dielectric layer; and
bonding a bulk silicon wafer to the second silicon nitride layer.

12. The method of 11, wherein the first and second silicon nitride layers comprise one of:
SiN and $Si_3N_4$ and the high-k dielectric layer comprises one of: hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), and erbium oxide ($ErO_x$).

* * * * *